United States Patent [19]

Kornrumpf et al.

[11] Patent Number: 5,206,712
[45] Date of Patent: Apr. 27, 1993

[54] BUILDING BLOCK APPROACH TO MICROWAVE MODULES

[75] Inventors: William P. Kornrumpf, Albany; David A. Bates, Fayetteville, both of N.Y.

[73] Assignee: General Electric Company, Schenectady, N.Y.

[21] Appl. No.: 504,760

[22] Filed: Apr. 5, 1990

[51] Int. Cl.⁵ .............................................. H01L 23/02
[52] U.S. Cl. .................................. 361/393; 333/247; 257/684; 257/728
[58] Field of Search ........................... 357/71, 74, 80; 333/238, 243, 244, 246, 247

[56] References Cited

U.S. PATENT DOCUMENTS

| | | | |
|---|---|---|---|
| 4,783,695 | 11/1988 | Eichelberger et al. | 357/68 X |
| 4,788,584 | 11/1988 | Hirano et al. | 357/80 X |
| 4,807,022 | 2/1989 | Kazior et al. | 357/71 X |
| 4,866,507 | 9/1989 | Jacobs et al. | 357/74 |
| 4,884,122 | 11/1989 | Eichelberger et al. | 357/80 X |
| 4,899,118 | 2/1990 | Polinski, Sr. | 333/247 X |
| 4,933,042 | 6/1990 | Eichelberger et al. | 156/239 |

Primary Examiner—Tod R. Swann
Attorney, Agent, or Firm—Marvin Snyder

[57] ABSTRACT

Microwave components are prepackaged and pretested to provide standard microwave components or subsystems. A dielectric overlay interconnection structure enables accurate testing and rework of out of specification packages. Microwave systems are formed of a plurality of such prepackaged components with a high yield.

49 Claims, 6 Drawing Sheets

BUILDING BLOCK APPROACH TO MICROWAVE MODULES

RELATED APPLICATIONS

The present invention is related to application Ser. No. 07/504,821, entitled, "HDI Microwave Circuit Assembly", by W. P. Kornrumpf, et al.; application Ser. No. 07/504,803, entitled, "Microwave Component Test Method and Apparatus", by W. P. Kornrumpf, et al.; application Ser. No. 07/504,753, entitled, "A Compact High Density Interconnected Microwave System" by W. P. Kornrumpf; application Ser. No. 07/504,769, entitled, "A Flexible High Density Interconnect Structure and Flexibly Interconnected System", by C. W. Eichelberger, et al.; and application Ser. No. 07/504,748, entitled, "Microwave Component Having Tailored Operating Characteristics and Method of Tailoring", by W. P. Kornrumpf, et al.; each of which is being filed concurrently herewith and each of which is incorporated herein by reference in its entirety.

BACKGROUND OF THE INVENTION

1. Field of the Invention

The present invention relates to the field of microwave circuits, and more particularly, to packaging of monolithic microwave integrated circuits and/or other active devices and passive components and their assembly into larger microwave systems.

2. Background Information

Microwave systems are often composed of monolithic microwave integrated circuits (MMICs), other active microwave devices such as GaAs transistors, passive microwave components and other non-microwave components such as logic and control structures.

A monolithic microwave integrated circuit or MMIC is an integrated circuit which is designed to operate at microwave frequencies. MMICs are normally fabricated in GaAs because of the much higher potential operating frequency which GaAs provides as compared to silicon. A typical MMIC may include one or more amplifiers, some passive components and one or more feedback loops which provide feedback from the output of an amplifier or circuit to establish a desired transfer function for that circuit.

It is known in the art to fabricate microwave systems from a variety of such components by providing a ceramic substrate having microstrip RF circuitry, DC supply lines (conductors), logic lines, control lines and contact pads fabricated thereon and by attaching devices and components such as MMICs, GaAs transistors, other microwave and supporting components to the substrate and connecting them to the circuitry on the substrate using wire bonds or tab interconnections.

Such fabrication techniques have a number of disadvantages. Thin and thick film methods of fabricating circuitry on ceramic substrates have tolerance limitations which prevent such structures from being produced with microwave characteristics which are repeatable with close tolerances. Consequently, there is substrate-to-substrate variation in the microwave characteristics of such nominally identical substrates. Further, the active microwave components such as MMICs and GaAs transistors themselves have fabrication tolerances which result in variations in operating characteristics from device to device. Further, in such structures, impedance discontinuities and mismatches are normal at the edges of MMICs and GaAs transistors. These impedance discontinuities vary with the actual placement of the chips on the surface of or in cavities in the ceramic substrate. This is because slight changes in the positioning of such devices change both the lengths of the gaps between the device and the substrate and the alignment of the device structure with the substrate structure. Further, these physical assembly tolerances result in variable interconnect bond lengths, resulting in variable inductances and consequently, varied circuit performance. These impedance mismatches also vary with actual component and substrate impedance values. Further, these and other fabrication-tolerance-induced differences in impedances result in reflections and other undesirable operational effects which degrade system operating characteristics. The cumulative effect of these differences is a wide range of system operating characteristics. Consequently, assembly of a microwave system from such components is a relatively low yield process in which many of the resulting systems do not meet specifications. A significant contributor to this low yield is the fact that many active microwave components cannot readily be accurately tested over their full expected operating frequency and power ranges in a non-destructive manner because of the difficulty of coupling such components to a test system. Consequently, many components which pass preassembly testing do not in reality meet specifications.

As the desired operating frequency of such microwave systems has increased from the neighborhood of 2 GHz to still higher frequencies in the range from 8 GHz to 16 GHz, or more, the problem of thin film and thick film fabrication tolerances and component testing have become ever more vexing.

Many MMICs and other active microwave devices include delicate structures which can easily be damaged or destroyed. These include conductors which are spaced from the surface of the GaAs by an air gap—a structure which is known as an "air bridge". Air bridges are used in these MMICs in order to provide the MMIC with particular desired operational characteristics. These delicate structures severely limit the assembly techniques which can be used to connect these devices into microwave systems. Further, such components are quite sensitive to the placement near their surfaces of conductors or dielectric materials having dielectric constants of more than one, especially in the vicinity of inductors, air bridges and field effect device gate regions.

In digital systems, individual chips can be extensively tested using wafer probe and other test systems before being committed to assembly into individual packages. After packaging, they can be further tested prior to assembly into a system. As a result, yield at system assembly is normally quite high. It is this assurance of successful assembly of digital components into an operative final system which has made feasible the provision of microcomputers and other digital systems at cost-for-performance prices which were unimaginable a decade ago.

Such pre-packaging has been impossible with active microwave devices because the losses and other penalties which packaging introduces are worse than the disease packaging would be intended to cure. Consequently, for microwave systems, post-packaging testing is not available at a component level as a final-assembly-yield-enhancement mechanism. Even full testing of components at a wafer level is not normally feasible because of the relatively large probe which is needed to provide an impedance match to the MMICs or other devices under test. However, the problem of low final yield has led to the design of some active microwave components for testing with so-called co-planar probe such as those built by Cascade Microtech. This requires that the chips be made over-sized in order to provide space on their upper surface for a microwave port having a signal conductor in the middle and two true ground conductors symmetrically disposed on opposite sides of that signal conductor. This structure is required for a co-planar probe to be connected to this microwave port in a well-matched, repeatable manner. The provision of a true ground on the upper surface of a microwave chip is not a simple matter at microwave frequencies (unlike the situation with digital chips which typically operate at frequencies of less than 50 MHz). Generally, this requires the use of a metal connection between the front and back surfaces of the chip. Such metal connections can be provided by plated through holes, but the provision of plated through holes increases the complexity of the fabrication process and decreases yield. Even those chips which are designed for co-planar probing cannot be tested at full power across their full operative range with a co-planar probe because of the poor thermal conductivity of MMICs. Consequently, design of a microwave device for co-planar probing has its own associated penalties such as increased size, increased process complexity, lower process yield and still suffers from a lack of complete assurance that test results will correlate with system performance.

A significant problem with the low yield of fully assembled systems is that such structures cannot be effectively reworked to replace faulty components because the component's connections cannot be removed in a non-destructive manner. Consequently, systems which are out of specification when assembled must be scrapped. Alternatively, if the microwave module is designed to allow rework, rework-induced damage is common, with a consequent limited reworked-induced increase in yield.

Thus, there is a continuing need for a microwave fabrication process which enables passive components to be fabricated with highly repeatable characteristics and which enables pre-testing of active devices and/or the removal and replacement of faulty components without impairing any good components when a system fails to meet specifications.

A high density interconnect (HDI) structure or system which has been developed by General Electric Company offers many advantages in the compact assembly of digital and other electronic systems. For example, an electronic system such as a microcomputer which incorporates between 30 and 50 chips can be fully assembled and interconnected on a single substrate which is 2 inches long by 2 inches wide by 0.050 inch thick. The maximum operating frequency of such systems is normally, at present, less than about 50 MHz. Even more important than the compactness of this high density interconnect structure is the fact that it can be disassembled for repair or replacement of a faulty component and then reassembled without significant risk to the good components incorporated within the system. This reworkability or repairability is a substantial advance over prior connection systems in which reworking the system to replace damaged components was either impossible or involved substantial risk to the good components.

Briefly, in this high density interconnect structure, a ceramic substrate such as alumina which may be 25-100 mils thick and of appropriate size and strength for the overall system, is provided. This size is typically less than 2 inches square. Once the position of the various chips has been specified, individual cavities or one large cavity having appropriate depths at the intended locations of the various chips are prepared. This may be done by starting with a bare substrate having a uniform thickness and the desired size. Conventional, laser or ultrasonic milling may be used to form the cavities in which the various chips and other components will be positioned. For many systems where it is desired to place chips edge-to-edge, a single large cavity is satisfactory. That large cavity may typically have a uniform depth where the semiconductor chips have a substantially uniform thickness. Where a particularly thick or a particularly thin component will be placed, the cavity bottom must be made respectively deeper or shallower to place the upper surface of that component in substantially the same plane as the upper surface of the rest of the components and the surface of the portion of the substrate which surrounds the cavity. The bottom of the cavity is then provided with a thermoplastic adhesive layer which may preferably be polyetherimide resin available under the trade name ULTEM ® from the General Electric Company. The various components are then placed in their desired locations within the cavity, the entire structure is heated to the softening point of the ULTEM ® polyetherimide (in the vicinity of 217° C. to 235° C. depending on the formulation used) and then cooled to thermoplastically bond the individual components to the substrate. At this stage, the upper surfaces of all components and the substrate are disposed in substantially a common plane. Thereafter, a polyimide film which may be Kapton ® polyimide, available from E. I. du Pont de Nemours Company, which is about 0.0005-0.003 inch (12.5-75 microns) thick is pretreated to promote adhesion and coated on one side with an ULTEM ® polyetherimide resin or another thermoplastic and laminated across the top of the chips, other components and the substrate with the ULTEM ® resin serving as a thermoplastic adhesive to hold the Kapton ® in place. Thereafter, via holes are laser drilled in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a which is scanned relative to the substrate laser to provide an accurately aligned conductor pattern at the end of the process.

Additional dielectric and metallization layers are provided as required in order to provide all of the desired electrical connections among the chips. Any misposition of the individual electronic components and their contact pads is compensated for by an adaptive laser lithography system which is the subject of some of the U.S. Patents and Patent Applications which are listed hereinafter.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1989, entitled "Method and Apparatus for Removing Components Bonded to a Substrate" by R. J. Wojnarowski, et al.; U.S. patent application Ser. No. 310,149, filed Feb. 14, 1989, entitled "Laser Beam Scanning Method for Forming Via Holes in Polymer Materials" by C. W. Eichelberger, et al., now U.S. Pat. No. 4,894,115; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. patent application Ser. No. 283,095, filed Dec. 12, 1988, entitled "Simplified Method for Repair of High Density Interconnect Circuits" by C. W. Eichelberger, et al., now U.S. Pat. No. 4,878,991; U.S. patent application Ser. No. 305,314, filed Feb. 3, 1989, entitled "Fabrication Process and Integrated Circuit Test Structure" by H. S. Cole, et al., and now abandoned in favor of continuation application Ser. No. 559,532, filed Jul. 19, 1990; U.S. patent application Ser. No. 250,010, filed Sep. 27, 1988, entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnected Assemblies" by R. J. Wojnarowski, et al.; U.S. patent application Ser. No. 253,020, filed Oct. 4, 1988, entitled "Laser Interconnect Process" by H. S. Cole, et al., now U.S. Pat. No. 4,960,613; U.S. patent application Ser. No. 230,654, filed Aug. 5, 1988, entitled "Method and Configuration for Testing Electronic Circuits and Integrated Circuit Chips Using a Removable Overlay Layer" by C. W. Eichelberger, et al., now U.S. Pat. No. 4,884,122; U.S. patent application Ser. No. 233,965, filed Aug. 8, 1988, entitled "Direct Deposition of Metal Patterns for Use in Integrated Circuit Devices" by Y. S. Liu, et al., and now abandoned; U.S. patent application Ser. No. 237,638, filed Aug. 23, 1988, entitled "Method for Photopatterning Metallization Via UV Laser Ablation of the Activator" by Y. S. Liu, et al., now U.S. Pat. No. 4,882,200; U.S. patent application Ser. No. 237,685, filed Aug. 25, 1988, entitled "Direct Writing of Refractory Metal Lines for Use in Integrated Circuit Devices" by Y. S. Liu, et al., and now abandoned; U.S. patent application Ser. No. 240,367, filed Aug. 30, 1988, entitled "Method and Apparatus for Packaging Integrated Circuit Chips Employing a Polymer Film Overlay Layer" by C. W. Eichelberger, et al., now U.S. Pat. No. 4,933,042; U.S. patent application Ser. No. 342,153, filed Apr. 24, 1989, entitled "Method of Processing Siloxane-Polyimides for Electronic Packaging Applications" by H. S. Cole, et al., now U.S. Pat. No. 4,897,153; U.S. patent application Ser. No. 289,944, filed Dec. 27, 1988, entitled "Selective Electrolytic Deposition on Conductive and Non-Conductive Substrates" by Y. S. Liu, et al., now U.S. Pat. No. 4,988,412; U.S. patent application Ser. No. 312,536, filed Feb. 17, 1989, entitled "Method of Bonding a Thermoset Film to a Thermoplastic Material to Form a Bondable Laminate" by R. J. Wojnarowski, and now abandoned; U.S. patent application Ser. No. 363,646, filed Jun. 8, 1989, entitled "Integrated Circuit Packaging Configuration for Rapid Customized Design and Unique Test Capability" by C. W. Eichelberger, et al.; U.S. patent application Ser. No. 07/459,844, filed Jan. 2, 1990, entitled "Area-Selective Metallization Process" by H. S. Cole, et al.; U.S. patent application Ser. No. 07/457,023, filed Dec. 26, 1989, entitled "Locally Orientation Specific Routing System" by T. R. Haller, et al.; U.S. patent application Ser. No. 456,421, filed Dec. 26, 1989, entitled "Laser Ablatable Polymer Dielectrics and Methods" by H. S. Cole, et al.; U.S. patent application Ser. No. 454,546, filed Dec. 21, 1989, entitled "Hermetic High Density Interconnected Electronic System" by W. P. Kornrumpf, et al.; U.S. patent application Ser. No. 07/457,127, filed Dec. 26, 1989, entitled "Enhanced Fluorescence Polymers and Interconnect Structures Using Them" by H. S. Cole, et al.; and U.S. patent application Ser. No. 454,545, filed Dec. 21, 1989, entitled "An Epoxy/Polyimide Copolymer Blend Dielectric and Layered Circuits Incorporating It" by C. W. Eichelberger, et al., and now abandoned in favor of divisional application Ser. No. 646,112, filed Jan. 28, 1991. Each of these Patents and Patent Applications is incorporated herein by reference.

This high density interconnect system has been developed for use in interconnecting semiconductor chips to form digital systems. That is, for the connection of systems whose operating frequencies are typically less than about 50 MHz, which is low enough that transmission line and other wave impedance matching effects have not needed to be considered.

The interconnection of microwave structures presents many problems, considerations and challenges not faced in the interconnection of digital systems. Use of microwave frequencies requires consideration of wave characteristics, transmission line effects, material properties at microwave frequencies, the presence of exposed delicate structures on MMICs and other components and system and component characteristics which do not exist at the lower operating frequencies of such digital systems. These considerations include the question of whether the dielectric materials are suitable for use at microwave frequencies, since materials which are good dielectrics at lower frequencies can be quite lossy or even conductive at microwave frequencies. Further, even if the dielectric is not lossy at microwave frequencies, its dielectric constant itself may be high enough to unacceptably modify the operating characteristics of MMICs, GaAs transistors and other microwave components or structures which might be interconnected using a high density interconnect structure. Since the first dielectric layer of this high density interconnect structure is applied by a lamination process involving the application of substantial pressure to the polyimide film, there is a substantial concern that air bridges and other delicate structures in microwave components may be damaged, destroyed or modified either by the lamination pressure causing them to collapse or by the infiltration of the thermoplastic adhesive into the air gap under the conductor, thereby modifying the dielectric properties of that gap, or even the mere presence of the dielectric unacceptably modifying the operating characteristics of some of the components.

Because of the low yield of finally assembled microwave systems, such systems are quite expensive both because of ultimate component cost and because the fabrication process is more akin to engineering than to semiconductor fabrication techniques. In order to increase the yield of final systems and to reduce their cost to the point where they become feasible for use in everyday systems, there is a need for a technique for packaging individual microwave components and subsystems in an efficient, high yield manner which enables such components and subsystems to be assembled into final systems with a high yield.

The related application Ser. No. 07/504,821, entitled, "HDI Microwave Circuit Assembly" overcomes the problems of reworkability and poor passive component tolerances of the prior art thin and thick film microwave system assembly methods whereby if a microwave system, when assembled does not meet specifications, it can be disassembled for removal of faulty components and reassembled without danger to good components.

In the microwave field, there is need for an assurance of successful assembly in order to bring the cost-for-performance prices of microwave systems down to the point where their use becomes widely feasible in consumer and other systems which would benefit from their capabilities.

OBJECTS OF THE INVENTION

Accordingly, a primary object of the present invention is to provide a technique for packaging microwave components as microwave devices, components or subsystems which meet tight performance and characteristic specifications which enable such packages to be assembled into operative systems with a high yield.

Another object of the present invention is to provide a microwave system comprised of prepackaged components or subsystems having tight tolerances which enable direct substitution of any like component or subsystem.

Another object of the present invention is to package and fully test microwave devices, components and subsystems prior to assembling them into systems.

SUMMARY OF THE INVENTION

The above and other objects which will become apparent from the specification as a whole, including the drawings, are achieved in accordance with the present invention by mounting microwave components on a package substrate and providing package microwave transmission lines coupled to microwave signal ports of the components in an impedance matched manner in which the package microwave transmission line impedances are tailored to the actual impedances of the components while simultaneously providing package microwave ports having closely specified impedances and which are suitable for the connection of external microwave transmission lines. Such packaged components or subsystems can be fabricated in quantity, stockpiled or inventoried for subsequent use in the assembly of microwave systems as needed, with system assembly being accomplished with high yield and at reasonable cost. Thus, a microwave system is assembled from a plurality of prepackaged microwave components or subsystems in a routine manner with high yield.

In accordance with one embodiment, the package microwave transmission lines and other interconnections are provided by a high density interconnect structure comprising a dielectric layer bonded to the microwave devices and conductors formed on that dielectric and connected to contact pads of the microwave devices through via holes in the dielectric.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

As is discussed in more detail in related application Ser. No. 07/504,821 (RD-19,880), we have established that the dielectric overlay technique taught in the above-cited background high density interconnect (HDI) patents and applications can be adapted to microwave systems under appropriate conditions.

Figure 1:
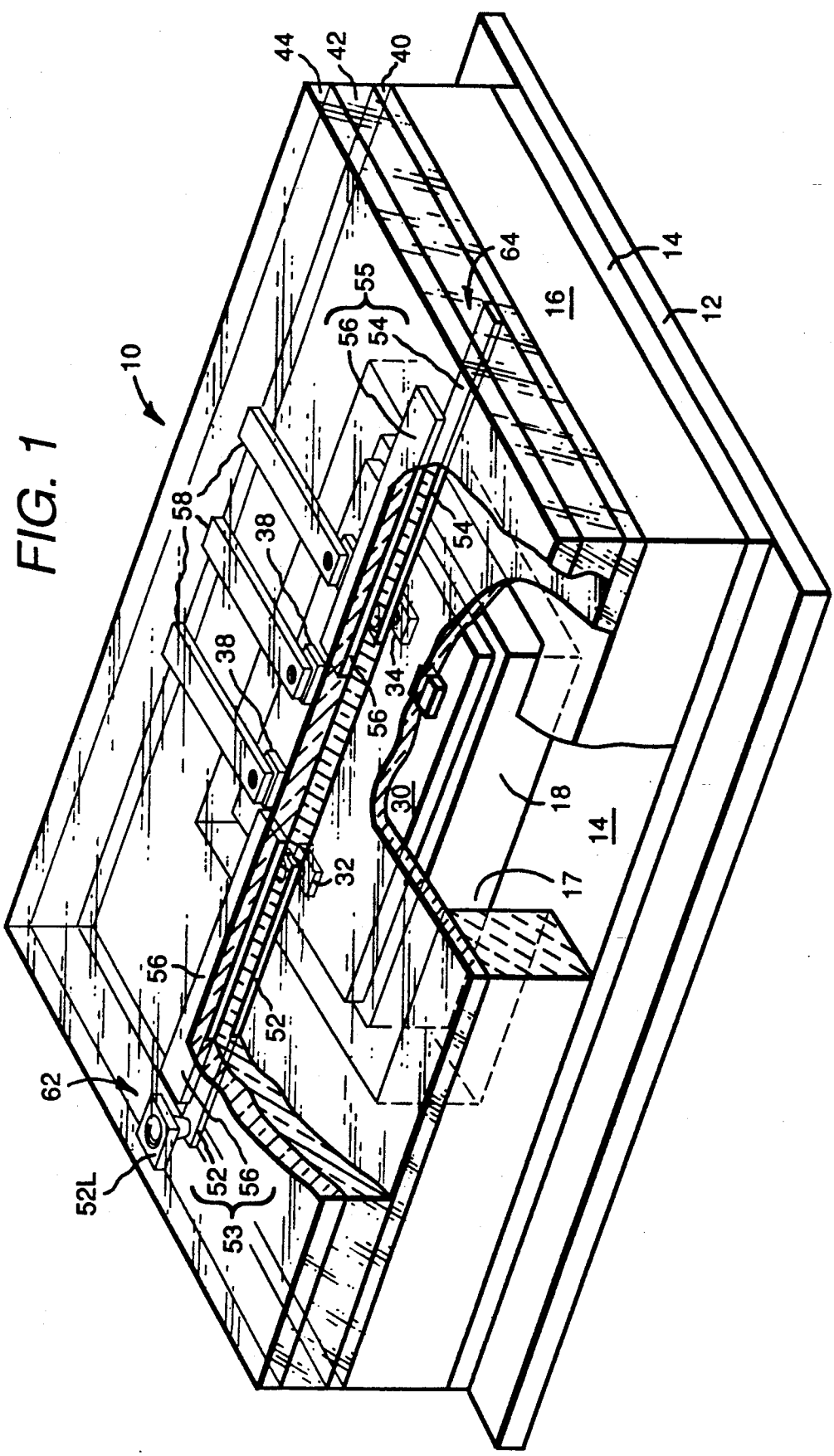
FIG. 1 is a perspective, partially cutaway view of a packaged component in accordance with the present invention.

A package 10, in accordance with the present invention which incorporates a microwave component 30 is illustrated in perspective, partially cutaway view in FIG. 1. The packaged device 10 comprises a package base 12 having a ground plane 14 disposed on the upper surface thereof. An insulating substrate 16 is disposed on the ground plane 14. The substrate 16 has a rectangular aperture 17 near the center thereof in which a further substrate portion 18 is disposed. In the illustrated configuration, the substrate portion 18 is disposed on the ground plane 14. However, other configurations may also be used. The active microwave component 30 is disposed on the upper surface of the substrate portion 18. The active component 30 has a plurality of electrical contact pads on the upper surface thereof. Toward the left-hand edge of the figure the component 30 has an input microwave terminal 32, while toward the right-hand side of the figure, it has an output microwave terminal 34. Also illustrated are four representative non-microwave terminals 38. These terminals may be DC power terminals, logic input or output terminals or control terminals as are suitable to the particular active microwave component. The DC, logic and control terminals 38 of the component 30 may be referred to collectively as support terminals in the sense that they are intended to carry electrical signals which support the operation of the microwave component, although those signals are not themselves microwave signals. If one of the terminals 38 is a ground terminal, then the ground terminal may be considered a support terminal. In the event that the only ground connection provided on the component 30 is a ground conductor on the back surface of the component, that ground terminal may be viewed as being distinct from the support terminals which are configured as top surface contact pads or may be considered a support terminal because of its function.

This microwave component may be a monolithic microwave integrated circuit (MMIC), a gallium arsenide (GaAs) transistor or other active microwave component as may be appropriate. Alternatively, it may be a passive, prefabricated microwave component, as may be considered desirable. While only two microwave terminals 32 and 34 are illustrated in FIG. 1, it will be understood that as many microwave terminals may be provided as is appropriate to the particular component 30. Further, more than one component may be included in a package as may be appropriate to the intended function of the package.

A package dielectric layer 40 is disposed on the upper surface of the active component 30, the substrate portion 16 and, to the extent that it is exposed, the substrate portion 18. As explained in the Background Information section of this specification, the dielectric layer 40 preferably comprises a preformed thermoset polyimide layer bonded to the substrate and component by a layer of thermoplastic polyetherimide.

By a thermoplastic polymer material, we mean that upon multiple cycles of heating and cooling, the melting point of the polymer material remains substantially unchanged. That is, no substantial cross-linking of the material takes place during the heating, melting and resolidifying process. Such polymers are suitable as adhesive layers for bonding higher temperature materials, including polymers, to substrates and may also themselves be used as layers to be bonded to substrates through the use of lower temperature adhesive layers. By a thermoset polymer material, we mean a polymer material in which cross-linking takes place the first time it is heated or during its preparation process, such that the material either no longer melts or melts at a much higher temperature than it did prior to its initial heating or its formation, as the case may be.

A first patterned conductive layer is disposed on this first dielectric layer 40. The patterned conductive layer includes first and second microwave signal conductors 52 and 54 which are disposed in ohmic contact, respectively, with the first and second microwave signal terminals 32 and 34 on the component 30. This connection is provided by forming via holes in the dielectric over the contact pads on the component 30 and depositing the metal of conductors 52 and 54 over the dielectric and in the via holes. Also included in this first patterned conductive layer are a plurality of non-microwave conductors 58 which are connected to the terminals 38. These connections are formed in the same way as the connections between the conductors 52 and 54 and contact pads 32 and 34. All of the conductors on dielectric layer 40 are preferably formed at the same time, either by depositing a continuous metal layer and then patterning it or by depositing the metal in a patterned manner, both as taught in the background patents and applications. These conductors preferably comprise several layers of metal as taught in the background patents. In particular, an initial adhesion promoting layer of titanium or chrome is preferably formed directly on the dielectric layer. This is followed by a layer of copper. Another layer of titanium may be disposed over the copper to passivate it.

This interconnection structure includes unique features when it is fabricated by first bonding the dielectric layer to the underlying structure, then forming the via holes in the dielectric by laser "drilling" from above and then depositing the metal of the conductors 52 and 54 over the dielectric and in the via holes where it makes ohmic contact to the underlying contact pad or other metallization. In particular, the external configuration of the metal in the via hole takes on the shape of the via hole, rather than vice versa as would be the case if the metal were formed first (as by wire bonding or other processes) and the dielectric filled in around it. The nature of the laser drilling process, which is used to form the via holes by drilling from the top, typically results in a via hole which is wider at the top than at the bottom. This via hole shape provides improved metal continuity between the portion of a conductor which is disposed at the bottom of a via hole and the portion which is outside the via hole. This is because the via hole wall surface on which the metal is deposited has a sloping-upward-and-outward configuration which is known from the semiconductor arts to result in a deposited metallization layer achieving better step coverage than is achieved where the step has a vertical wall surface. The term step coverage refers to the uniformity of the metal coverage where the deposition surface changes levels from one planar surface area (the bottom of the via hole) to another planar surface area (the top of the dielectric layer). When the conductors are formed in accordance with the preferred manner described in the background Patents and Patent Applications, the upper surface of the metal conductor typically has a depression or dimple in it at the via hole because the metal of the conductors is deposited to a substantially uniform thickness everywhere, including in the via holes (which are not filled prior to deposition of the metal across the planar surface of the dielectric layer). Consequently, the surface topology of the metallization is similar to the surface topology of the layer on which it is deposited.

A second dielectric layer 42 is disposed over this first patterned conductive layer and the first dielectric layer 40. A second patterned conductive layer is disposed on top of this second dielectric layer 42. In the illustrated embodiment, the second conductive layer comprises two ground conductors 56 which are disposed in alignment with the microwave signal conductor lines 52 and 54 to form microwave transmission lines 53 and 55, respectively. First and second microwave ports 62 and 64 are disposed at the left-hand and right-hand sides of the structure in the figure. In general, the term "port" is used to refer to a structure suitable for coupling an input signal into the system, package or component or a structure which is suitable for coupling a signal out of the component package or system. As such, where ohmic connections are employed, a port normally comprises a signal terminal and a ground terminal. Many ports may have a common ground terminal with individual signal terminals. Where optical coupling is employed, then the optical transmitter and the optical receiver both serve as ports. Where a tubular microwave transmission line is employed, a port, especially a radiating horn, does not have separate signal and ground terminals, but rather is defined by its function. The first microwave port 62 is coupled via the transmission line 53 to the first microwave terminal 32 of the component 30. In a similar manner, the second microwave terminal 34 of the component is coupled by the transmission line 55 to the second microwave port 64. A third, optional, dielectric layer 44 overlies conductors 56 and dielectric layer 42. The third dielectric layer may be omitted, especially when the upper surface of the conductors 52, 54 and 56 is titanium (Ti) which serves as a passivating layer which makes the presence of layer 44 unnecessary for environmental passivation purposes. Omission of layer 44 simplifies testing and connection of these packaged components as well as the process of fabricating them. While the two conductors 56 are illustrated as being separate, it should be understood that they may be continuous, if desired.

This packaged component 10 comprises a microwave subsystem having specified input and output microwave impedances. This packaged component is easily tested for its microwave operating characteristics by connecting a probe either directly to the ports 62 and 64 or by connection of the package in a test structure such as taught in related application Ser. No. 07/504,803. In the event that the packaged component fails to meet subsystem specifications because of microwave mismatches in the package or other package related phenomena, the dielectric and conductor overlay structure 40, 42, 44, 52, 54, 56 and 58 may be removed from the package substrate 16, 18 and the active component 30 without damage to the component or package. This is done by heating the structure to a temperature which renders the thermoplastic adhesive portion of the dielectric layer 40 sufficiently fluid that the overlay structure may be peeled off the substrate and component without any damage thereto. Any remaining adhesive residue may be removed by dissolving it in a solvent for the thermoplastic adhesive or by laser ablation in combination with a $CF_4$ and $O_2$ plasma etch, or by the plasma etch alone. Use of a chemical solvent to remove residual adhesive is preferred for several reasons. First, it is a very effective method which treats the entire substrate and the component(s) 30 all at the same time. Second, it avoids exposing the surface of the component to the laser ablation energy and the plasma etch, either one of which might adversely affect the characteristics of a component. A new overlay structure may then be assembled on the package with the overlay structure modified to compensate for the conditions determined during the previous testing of the component. For example, if the initial testing of the packaged component shows that there is a mismatch in impedances between the transmission line 53 and the microwave terminal 32 on the component 30, the new overlay layer may be assembled with the transmission line 53 having a modified structure configured to provide an impedance match to the terminal 32 while maintaining the impedance of the port 62 at the desired package value. That is, a tapered or other impedance-transforming transmission line having appropriate transformation characteristics may be designed and fabricated as part of the high density interconnect structure. Preferably, a range of such transmission lines are predesigned to compensate for the expected range of component variation. In that way, the appropriate design for the modified transmission line may be selected from a library of existing designs, rather than the modified transmission line having to be designed from scratch each time.

This packaged component, when tested and found to successfully meet the component or subsystem specifications, may be placed in inventory for subsequent use in fabrication of a desired microwave system from a plurality of appropriate components. These packaged components or subsystems may be referred to collectively as modules since it is only the complexity of the internal structure which varies. While in FIG. 1 only a single component is illustrated, it will be understood that as many components as needed for a particular subsystem may be included in the package and interconnected by the package interconnection structure. The package 10 provides an excellent trade-off between the benefits of prepackaging the active microwave components and the normally undesirable effects of increased size and the prior art complications of packaging such as poor yield, imprecisely controlled package characteristics such as impedances, and so forth. When packaged in this manner, a rectangular component 30 may be packaged in a package having overall dimensions which are about 100 mils larger in each dimension than the component itself, with the benefit of providing tight tolerances on packaged component specifications and with the advantage of being able to rework the package without detriment to the component, if that should be necessary. Thus, this package provides a substantial advance in the microwave art since it achieves the benefits of prepackaging and does not suffer from the prior art disadvantages which made prepackaging impossible in the microwave art.

It will be noted that different configurations are used for the two ports 62 and 64 of this package. The port 62 has a signal conductor land $52_L$ disposed in the second conductor level (that is, On the same same level as the ground conductor 56). This is to facilitate connections to the signal conductor 52 at the port 62 by providing a uniform dielectric thickness over both the ground conductor 56 and the signal conductor 52. In the port 64, no land is provided in the ground conductor level with the result that a thicker dielectric is present over the point to which a signal conductor must be connected to the signal conductor 54 than is present where a ground conductor would be connected to the ground conductor 56. This packaged component may be provided with the dielectric layer 44 set back from the ports 62 and 64 to leave the conductor layers exposed for connection for testing and other purposes. Alternatively, the dielectric layer 44 may extend across these conductors to encapsulate them until such time as the packaged component is assembled into a larger system. In this second alternative, via holes are formed in the dielectric layer 44 at the time of testing, or if the packaged component is tested before the layer 44 is applied, then at same time that via holes are formed in the dielectric layer which overlies the various components of that larger system. As a third and possibly preferable alternative, the layer 44 may be omitted as discussed above in which case the contact pads are exposed at the upper surface of the package 10.

Figure 2:
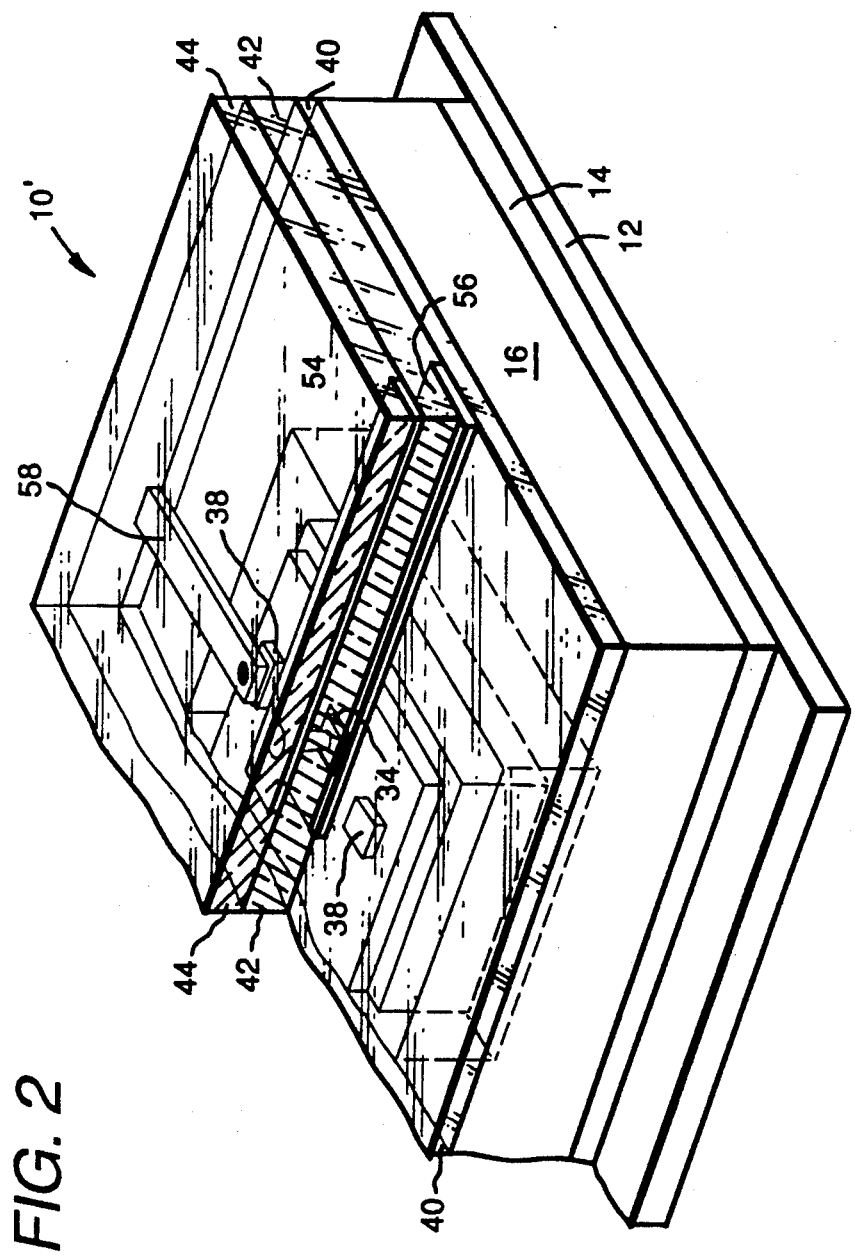
FIG. 2 is a perspective view of a portion of packaged component in accordance with an alternative configuration of the present invention.

A modified version 10' of the package 10 is illustrated in perspective view in FIG. 2. The package 10' is like the package 10, except for the configuration of the microwave transmission lines 55' and 53' (not shown). These transmission lines differ in that in the 10' embodiment, the ground conductor 56 is disposed in the first conductive layer, while the signal conductors 52 and 54 are disposed in the second conductive layer. That is, the ground conductors 56 are disposed between the signal conductors and the substrate 16 and the active component 30. Throughout this specification a reference numeral which is changed by adding a prime (') or a double prime (″) identifies similar structure which has been modified, but which serves the same or a similar function. Where unmodified elements are not specifically discussed in connection with a particular figure or embodiment, the reader is referred to an earlier discussion of that element for a discussion of its purpose of function.

In the illustrated configuration for the package 10′, an aperture is provided in each of the ground conductors 56 in alignment with the microwave signal terminals 32 and 34 in order to enable the overlying signal conductor 52 or 54, respectively, to be ohmically connected to the signal terminal 32 or 34, respectively, through a via hole in the overlying dielectric layers.

It will be recognized that other signal-conductor/-ground-conductor configurations in the vicinity of the microwave terminals 32 and 34 may be employed. For example, the ground conductor can stop short of the terminals 32 and 34 with the signal conductor extending over those terminals and being connected thereto through via holes in the dielectric layer.

Figure 3:
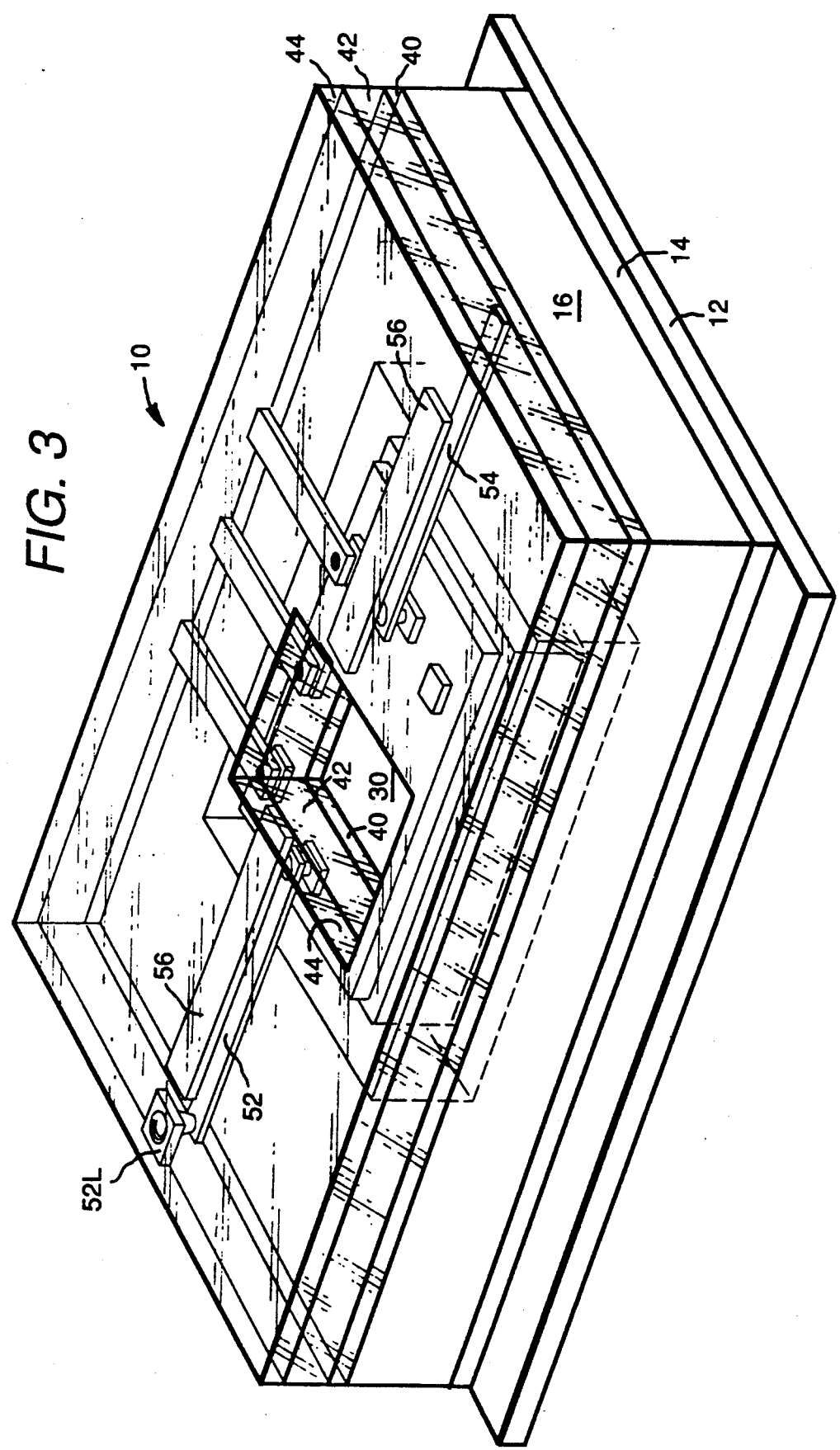
FIGS. 3 and 4 are perspective views of packaged components in accordance with alternative configurations of the present invention in which a portion of the microwave component is free of the dielectric material of the interconnection system.
Figure 4:
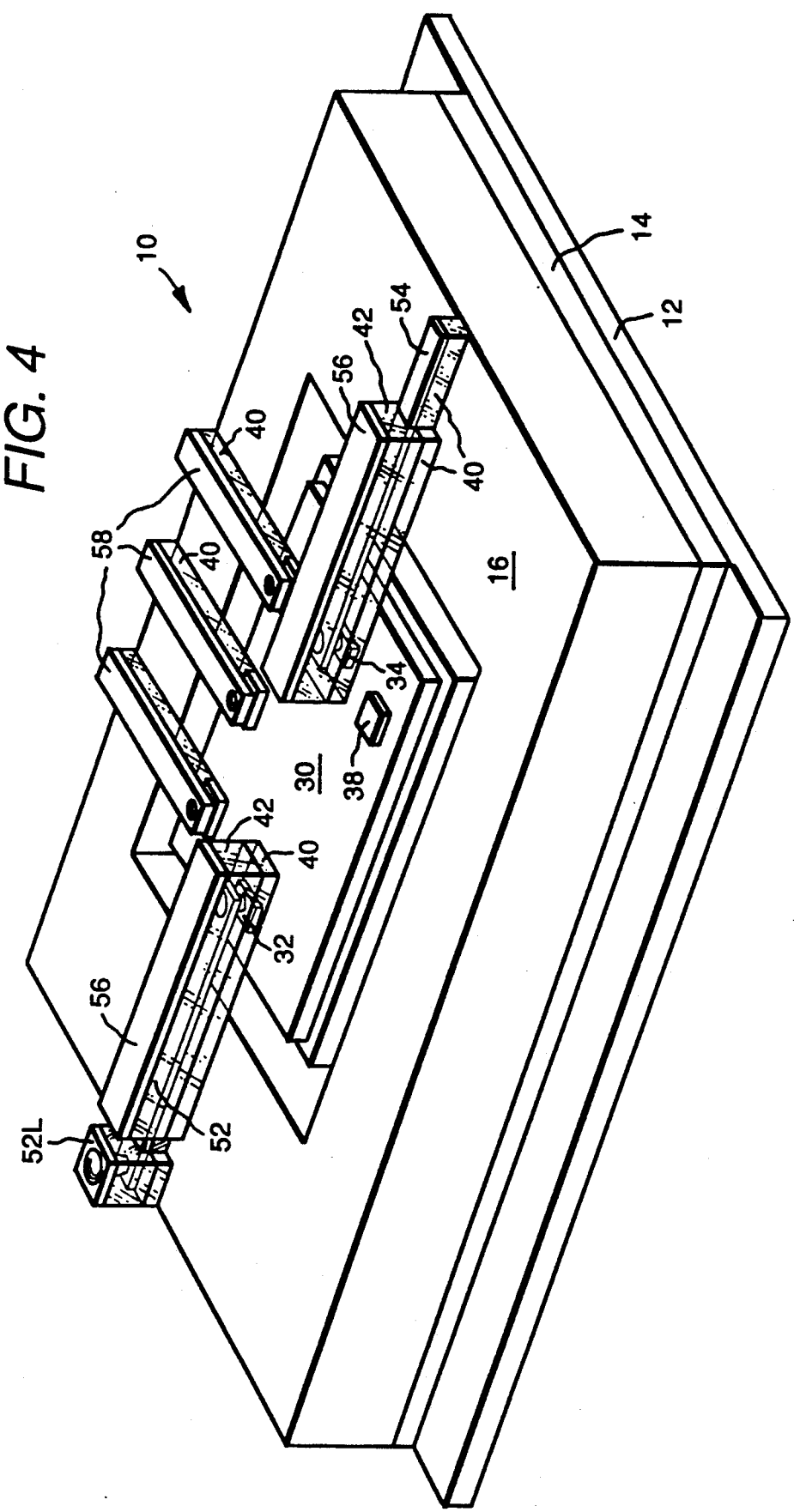

Two alternative configurations of the package 10 are illustrated in perspective view in FIGS. 3 and 4. The FIG. 3 package differs from the FIG. 1 package in that an aperture or window is formed in the dielectric structure 40, 42 and 44 over the active component 30 in order to provide an air dielectric thereover whereby the package dielectrics 40, 42 and 44 have a minimal and preferably insignificant affect on the operating characteristics of the component 30. This can be accomplished by masking the portions of the dielectric layer to be retained and dissolving the dielectric in an appropriate solvent or by laser ablating the dielectric to be removed followed by a plasma etch or treatment with a solvent for the adhesive to ensure than any residue is removed. The package in FIG. 4 provides similar advantages, but has its dielectric layers removed by laser ablation with the laser being swept across the entire upper surface of the package so that the metal conductors act as masks for any underlying dielectric whereby the dielectric is removed everywhere except where it is shadowed by a conductor.

It will be recognized that so long as the laser spot is sufficiently small, no mask is needed for laser ablation, since the pattern in which the laser is scanned will control the pattern of removal of the dielectric. Depending on the size of the area swept by the laser during the dielectric material removal process in the fabrication of the FIG. 3 structure, the resulting window in the dielectric can have a complicated outline determined by the combination of the the laser sweep pattern and the masking effects (as in the FIG. 4 fabrication process) of conductors which extend into the window swept by the laser. This latter configuration is preferable when it is desired to have the dielectric layer 40 seal the gap between the component 30 and the substrate to prevent any processing fluids from entering or becoming trapped in this gap. The packages of FIGS. 3 and 4 provide the reworkability advantages of the FIG. 1 and 2 packages with the additional advantage that the interconnection system produces is little or no detrimental effect on the operation of the component 30.

In FIGS. 1–4, the package ground conductor comprises two separate portions; the ground conductor 14 and the individual ground conductors 56 disposed within the high density interconnect structure. Further, in an embodiment in which the conductor 14 was omitted, that is, all of the package ground conductors are disposed within the high density interconnect structure, the ground conductor would be a patterned layer rather than a continuous layer.

Figure 5:
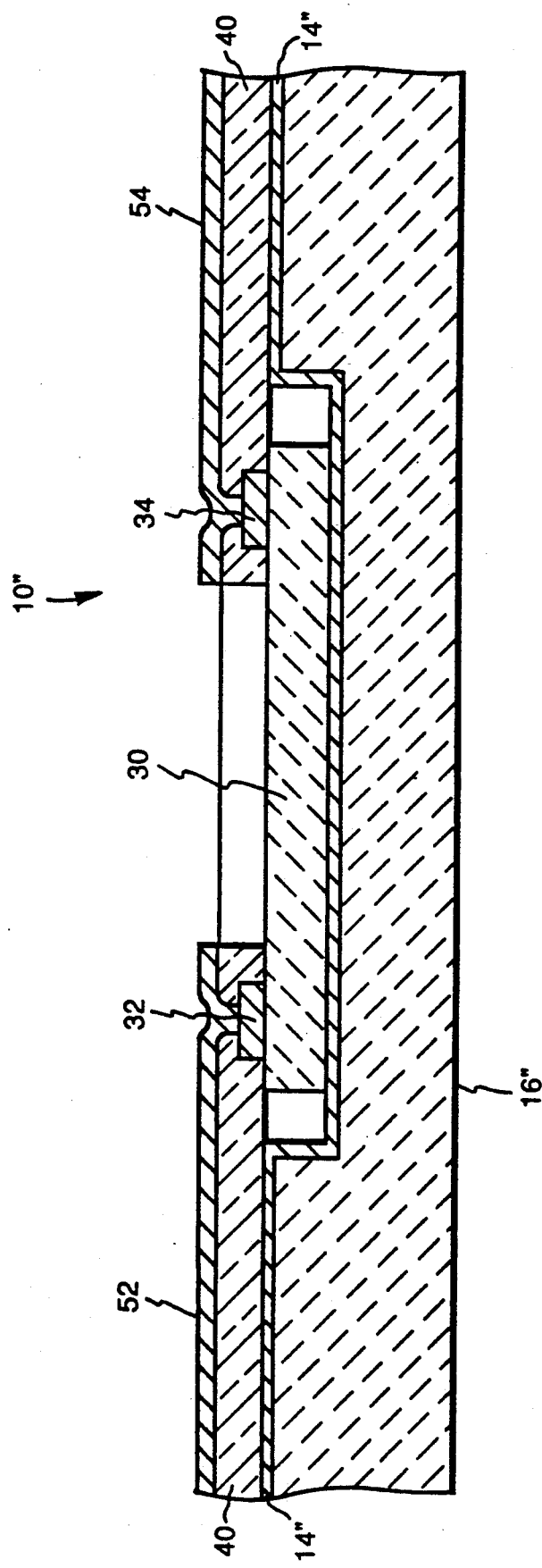
FIG. 5 is a cross-section view of a further alternative configuration of a packaged component in accordance with the present invention.

FIG. 5 is a cross-section illustration of an alternative package 10″. The package 10″ differs from the package 10′ in FIG. 3 in that the conductive ground layer 14 is omitted from the bottom surface of the ceramic substrate 16″ and dielectric layers 42 and 44 and the second layer of conductors are omitted from the high density interconnect structure. A ground conductor 14″ is disposed all over the upper surface of the substrate 16″. The ground conductor 14″ covers the bottom of the cavity 17 in which the component 30 is disposed, covers the walls of that cavity and the planar portion of the upper surface. This substrate configuration places the ground plane 14″ much closer both to the component 30 and to the overlying high density interconnection structure. The component 30 is soldered or bonded by a conductive adhesive to the ground conductor 14″ where electrical connection between the back surface of the component 30 and the ground conductor is desired. If isolation is desired, a non-conductive adhesive is employed. A single interconnection structure dielectric layer 40 is disposed on the upper surface of the component 30 and the exposed portions of the ground conductor 14″. The dielectric material 40 is removed from the center of the component 30 in a manner similar to that illustrated in either FIG. 3 or 4 to leave sensitive portions of the microwave component unaffected by the interconnection structure.

A single layer of conductors is disposed on the dielectric layer 40. In the figure, the signal conductors 52 and 54 are visible. DC conductors, logic conductors and control conductors 58 are also disposed on layer 40, but not illustrated in this figure. The conductors 52 and 54 are connected, respectively, to the microwave contact pads 32 and 34 of component 30 through via holes in the dielectric layer 40. This package structure has the advantage over the packages illustrated in FIGS. 1–4 of being less complex to fabricate since the high density interconnect structure contains only one dielectric layer and one layer of conductors, rather than multiple dielectric and conductor layers. In the package 10″, microwave signals are conducted by microstrip transmission lines 53″ and 54″ which are comprised of a ground conductor 14″ in combination, respectively, with the signal conductors 52 and 54. The upper surface of the interconnect structure conductors is preferably titanium or another metal which is self-passivating. In this way, any need for an overlying dielectric layer for environmental protection is avoided. Consequently, the package is as simple as possible.

Thus, the package ground conductor can be disposed solely on the substrate, as illustrated in FIG. 5, or may be disposed both on the substrate and in the high density interconnect structure, as illustrated in FIGS. 1–4, or may be disposed only within the high density interconnect structure, as would be the case in FIGS. 1–4 if the conductive ground plane layer 14 were omitted.

Another advantage of the package 10″ is the ready availability of the ground conductor 14″ at the upper surface of the substrate 16″. In this manner, a true microwave ground is provided on the upper surface of the package without any need for complex processing in order to bring a microwave ground from the back surface of the component 30 or the substrate 16 to the upper surface. This feature contributes to a simplification of the fabrication process and to an improvement in the controllability of the microwave operating characteristics. Where it is desired to employ a coplanar probe in testing this packaged component, the ground conductor 14" may be exposed at the surface merely by ablating the dielectric thereover in appropriate positions or may be brought to the same plane as the conductors 52 and 54 by forming via holes in the dielectric 40 in the desired location for ground contacts prior to deposition of the metal from which the conductors 52, 54, 58 and the ground contacts are to be formed. Alternatively, where the dielectric free portion of the surface of the component 30 is formed by laser ablation of the dielectric disposed thereover, a significant area of dielectric material may be removed at the microwave ports 62 and 64 in order to provide large ground-to-contact area for the coplanar probe by appropriately scanning the laser.

Figure 6:
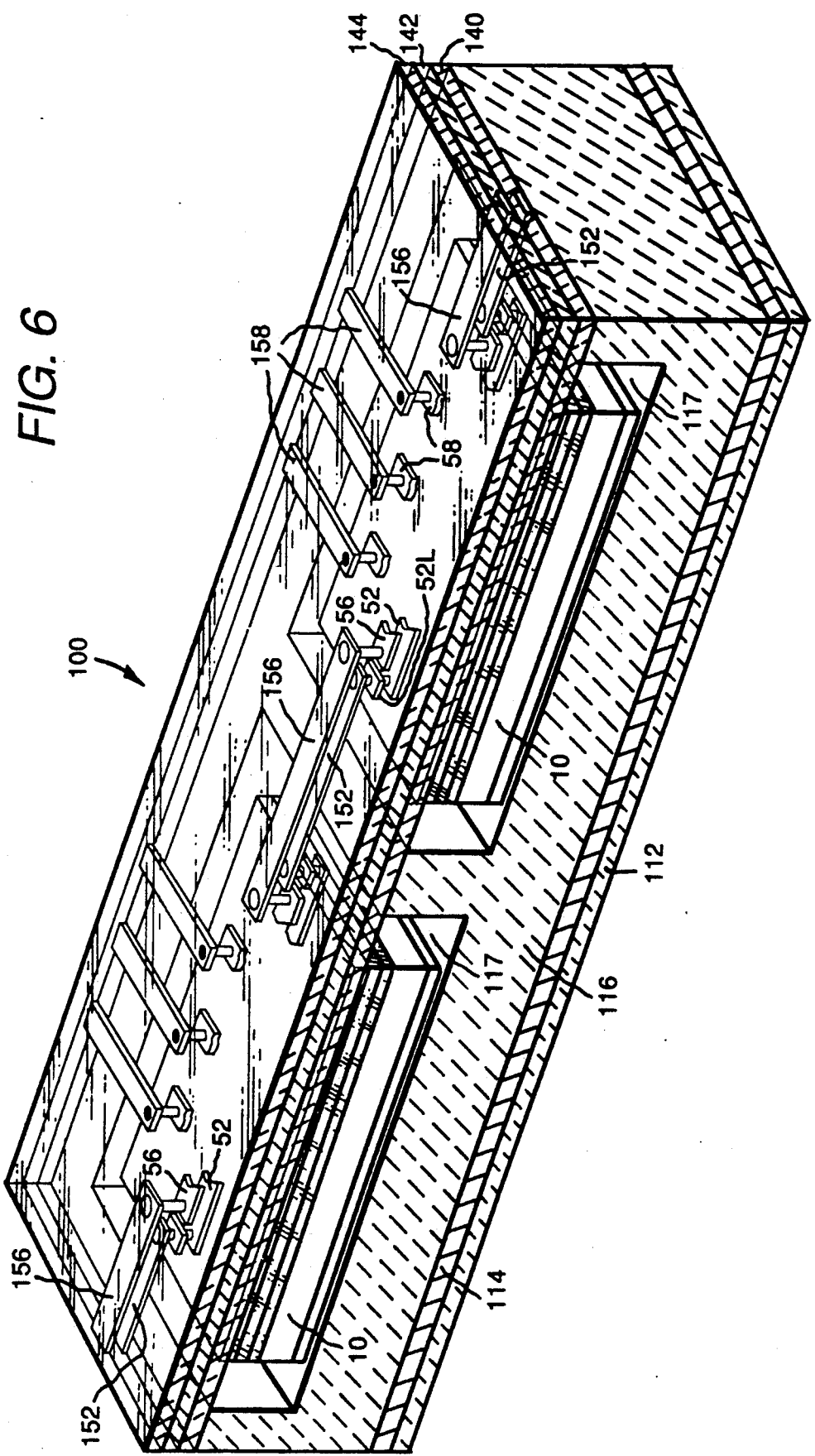
FIG. 6 is a perspective view of a microwave system assembled from a plurality of packaged components as illustrated in FIG. 1.

FIG. 6, illustrates in a perspective view a portion of a microwave system 100 which has been assembled from packaged components 10 of the FIG. 1 type.

The system 100 comprises a system base 112 having a system ground plane 114 disposed on the upper surface thereof and a dielectric substrate 116 disposed on the upper surface of the ground conductor. The substrate 116 has a plurality of apertures 117 therein in which individual prepackaged components 10 are disposed. A ground connection (not shown) is provided between the ground plane 114 and the base of the packages. Alternatively, the package ground conductor may be directly exposed at the bottom of the various cavities 117. A system dielectric layer 140 is disposed over the substrate 116 and each of the packages 10. System microwave signal conductors 152 are disposed in a patterned manner on the system dielectric layer 140. These conductors are connected by via holes to the signal conductors of the various packaged subsystem ports 62 and 64. Also disposed on dielectric layer 140 are system DC conductors, logic conductors and control conductors 158 which are connected to appropriate package conductors through via holes in dielectric layer 140. A second system dielectric layer 142 is disposed over the system signal conductors 152, system DC conductors, logic conductors and control conductors 158 and the portions of the first system dielectric layer 140 which are not covered by the conductors 152 and 158. A second system patterned conductive layer is disposed on the second system dielectric layer 142. This second system conductive layer comprises a plurality of ground conductors 156 which together with signal conductors 152, form microwave transmission lines which are impedance matched to the various microwave ports 62 and 64 on the various packages 10. A system dielectric layer 144 is disposed over the ground conductors 156 and the second system dielectric layer 142.

The system package base 112 may be modified by including a conductive upper surface in much the same way that the package base of FIG. 1 is modified to produce the package base of FIG. 5. In that case, a separate package ground plane 114 is not needed. Alternatively, a conductive package base can be used if thermal coefficient of expansion differences can be controlled or avoided among the devices or components and the package and system bases.

In this manner, a plurality of prepackaged components 10 are assembled into a final microwave system with high yield and reliability.

It will be noted that in FIG. 6, the dielectric layers of the separate packages are distinct from each other as well as being spaced apart from each other. While in FIG. 6 the individual packages 10 are illustrated as being disposed in separate cavities in the system substrate 116, it should be understood that a plurality of packages may be disposed in a single cavity with the system dielectric layer being disposed over the packages without the system dielectric layer being disposed on intervening portions of the substrate. Further, in such a structure, the system dielectric layer may be restricted to being disposed over only the packages and not extending over the system substrate. In that configuration, the system substrate may be omitted, if desired. In that case, the system dielectric layer is bonded to and supported by the individual packages.

In an embodiment in which individual packages are placed in a common cavity and positioned in abutment, the dielectric layers of two different packages may be disposed in contact, but are still distinct from each other due to their separate fabrication, or in the event that the two different packages had their high density interconnect structure fabricated at the same time to reduce the number of fabrication cycles required for the packaging of a given number of components, the dielectric layers would be distinct because of their subsequent separation in order to separate the packages for testing, handling, and so forth. In the event that the package dielectric layers are continuous with the high density interconnect structures having been fabricated at the same time, then those two "packages" may be viewed as comprising a single package even if those packages are further interconnected by the system interconnect structure.

For successful assembly of this system, the thermoplastic adhesive layers employed during the fabrication of the individual packages 10 must be a higher temperature material than the thermoplastic adhesive layer used in the fabrication of the system interconnection structure. Suitable thermoplastic layers include ULTEM ® 1000 and ULTEM ® 6000 polyetherimide resins available from General Electric Company. These are similar resins, but that the ULTEM ® 1000 has a $T_G$ of substantially 217° C., while the ULTEM ® 6000 has a $T_G$ of substantially 235° C. The second and subsequent dielectric layers used both in the packaging of the components and in the formation of the overall system are preferably epoxy/polyimide copolymer blends of the type taught in patent application Ser. No. 454,545 cited above as one of the background HDI patent applications.

Use of these different temperature materials is considered desirable for the assembly process in that the system structure may be assembled without danger of shifting of layers in the individual packages. Further, for repairability of the system without destruction of the packages, it is necessary that the system thermoplastic adhesive have a lower liquification temperature than the thermoplastic adhesive used in the packages in order that the system interconnection structure may be removed without affecting the individual package interconnection structures.

While a third dielectric layer 44 is illustrated in the packages 10 and 10', it will be understood that this dielectric layer may be omitted from the package, if desired, since the first system dielectric layer will provide electrical insulation over the upper layer of conductors 56 or 52 and 54. However, it may be considered desirable to provide the dielectric layer 44 for protection of the upper conductor layer during handling of the packages between the time of their fabrication and the time of their assembly into a larger system. Such a dielectric layer also serves to minimize any environmental attack on the upper conductor layer which might occur while the packaged devices are in storage prior to being assembled into a larger system.

In a similar manner, the upper dielectric layer 144 on the system structure may be omitted where other suitable electrical insulation and environmental protection is provided for the upper layer of conductors on the package.

The package 10 may be modified in a manner similar to package 10" while retaining its multilayer structure by use of a conductive package base 12 in which case a separate ground plane 14 is unnecessary and the substrate portions 16 and 18 are disposed directly on the package base. Such a structure is considered desirable where the system assembly process provides isolation as needed between separate packages because it reduces the thermal impedance between the active components and the system's package base by elimination of one layer of material and two interfaces.

The particular configuration employed both at the package and system stage are interrelated design choices in which appropriate tradeoffs may be made between fabrication simplicity, overall thermal impedance between active components and heat sinks, and so forth.

It will be understood that in the system structure, the transmission line ground conductors may be placed between the transmission line signal conductors and the substrate in a similar manner to that in which the signal and ground conductor locations may be reversed in the individual packages.

Further, if desired, in the package and system configurations in which a ground conductor is disposed between the signal conductor and the substrate, a second ground conductor may be placed above the signal conductor to provide a stripline microwave transmission line rather than a microstrip microwave transmission line. Further, where the substrate 16 is conductive or has a conductive surface, it inherently provides a ground plane whereby only a signal conductor of appropriate width (in combination with the dielectric layer thickness and dielectric constant) is needed to form a transmission line of a desired impedance in a manner which is similar to that achieved by package 10" of FIG. 5. With a conductive substrate (or one having a conductive surface), the FIG. 1 overlay structure inherently forms a stripline transmission line. Alternatively, coplanar or grounded coplanar transmission lines can be utilized, in which case ground and signal conductors are patterned in the same plane on top of the system dielectric layer 140 (FIG. 6). In that case, the additional system dielectric layers may be omittee in some cases.

In each of the figures the package is illustrated as comprising a substrate on which the component is disposed and on which a portion of the package dielectric layer is disposed. In FIG. 6, the system is illustrated as including a system substrate on which the packages are disposed. However, it should be recognized that the package substrate and/or the system substrate may be omitted where the component surface area is sufficient for the fabrication of the corresponding interconnection structure or where the high density interconnect structure is a flexible interconnect structure in accordance with related application Ser. No. 07/504,769, entitled "A Flexible High Density Interconnect Structure and Flexibly Interconnected System".

While both the package and the system are illustrated as employing electrical conductors for the connections between different components and different modules, it should be understood that optical coupling or a tubular waveguide may be employed as is appropriate to a system.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A packaged microwave component comprising:
    a microwave component having a microwave signal terminal;
    a package dielectric layer overlying said microwave component,
    a package signal conductor disposed on said package dielectric layer and coupled to said microwave signal terminal of said microwave component; and
    a package ground conductor ohmically connected to a ground conductor of said microwave component;
    said package signal conductor being spaced from said package ground conductor to form a package microwave transmission line which is coupled to said microwave signal terminal of said microwave component;
    said package microwave transmission line having a port portion suitable for coupling to an external microwave transmission line, whereby said component is suitable for assembly into a larger system.

2. The packaged microwave component recited in claim 1 wherein:
    said package dielectric layer is a polymer.

3. The packaged microwave component recited in claim 1 wherein:
    said port portion of said package microwave transmission line exhibits a specified microwave impedance.

4. The packaged microwave component recited in claim 1 wherein:
    said microwave component comprises a second microwave signal terminal;
    said package comprises a second package signal conductor spaced from said package ground conductor and coupled to said second component microwave signal terminal to form a second package microwave transmission line coupled to said second component microwave signal terminal.

5. The packaged microwave component recited in claim 4 wherein:
    the first recited package microwave transmission line comprises an input transmission line for said microwave component; and
    said second package microwave transmission line comprises an output transmission line for said microwave component.

6. The packaged microwave component recited in claim 5 wherein:
    said first and second package microwave transmission lines exhibit substantially the same impedance.

7. The packaged microwave component recited in claim 1 comprising:
    a plurality of said package signal conductors each disposed on said package dielectric layer.

8. The packaged microwave component recited in claim 1 comprising:
  a package support conductor disposed on said dielectric layer and connected to a support terminal of said microwave component.

9. The packaged microwave component recited in claim 8 comprising:
  a plurality of said package support conductors each connected to a different support terminal of said microwave component.

10. The packaged microwave component recited in claim 1 wherein:
  said package includes a second microwave component; and
  said package includes conductors interconnecting the first recited microwave component and said second microwave component.

11. The packaged microwave component recited in claim 10 wherein:
  said packaged component is connected in a system with additional similar packages;
  said system includes a system dielectric layer which is disposed on the first recited package and at least one of said additional packages.

12. The packaged microwave component recited in claim 1 wherein:
  said packaged component is connected in a system with additional similar packages;
  said system includes a system dielectric layer which is disposed on the first recited package and at least one of said additional packages.

13. The packaged microwave component recited in claim 1 comprising:
  a second package dielectric layer disposed on said package signal conductor and the first recited package dielectric layer.

14. The packaged microwave component recited in claim 13 further comprising:
  a second package signal conductor disposed on said second package dielectric layer.

15. The packaged microwave component recited in claim 13 further comprising:
  a second package ground conductor disposed on said second package dielectric layer.

16. The packaged microwave component recited in claim 15 wherein:
  said second package ground conductor is connected to the first recited package ground conductor and said package microwave transmission line comprises said package signal conductor and said first and second package ground conductors.

17. The packaged microwave component recited in claim 1 comprising:
  a package substrate;
  said microwave component being disposed on said package substrate;
  said package dielectric layer being disposed on said package substrate.

18. The packaged microwave component recited in claim 17 wherein:
  said package dielectric layer is bonded to said package substrate.

19. The packaged microwave component recited in claim 18 wherein:
  said package signal conductor extends over said package substrate.

20. The packaged microwave component recited in claim 1 wherein:
  said package microwave transmission line comprises a microstrip transmission line.

21. The packaged microwave component recited in claim 1 wherein:
  said package microwave transmission line comprises a coplanar transmission line.

22. An electronic system comprising:
  first and second microwave modules, each of said microwave modules including:
    a module substrate,
    a microwave electronic component disposed on said module substrate,
    a module dielectric layer overlying said substrate and said microwave component,
    a module ground conductor ohmically connected to a ground conductor of said microwave component,
    a module signal conductor disposed on said module dielectric layer and ohmically connected to a microwave signal terminal of said microwave component, said module signal conductor being spaced from said module ground conductor to form a module microwave transmission line;
  said dielectric layer of first module being distinct from said dielectric layer of said second module;
  a system dielectric layer overlying said first and second modules;
  a system ground conductor;
  first and second system signal conductors each disposed on said system dielectric layer and coupled respectively to said signal conductors of said first and second modules; and
  said system ground conductor in combination with said first and second system signal conductors forming, respectively, first and second system microwave transmission lines which are respectively coupled to said module microwave transmission lines of said first and second modules.

23. An electronic system comprising:
  first and second microwave modules, each of said microwave modules including:
    a microwave electronic component,
    a module dielectric layer overlying said microwave component,
    a module ground conductor ohmically connected to a ground conductor of said microwave component,
    a module signal conductor disposed on said module dielectric layer and ohmically connected to a microwave signal terminal of said microwave component, said module signal conductor being spaced from said module ground conductor to form a module microwave transmission line;
  said dielectric layer of first module being distinct from said dielectric layer of said second module;
  a system dielectric layer overlying said first and second modules;
  a system ground conductor;
  first and second system signal conductors each disposed on said system dielectric layer and coupled respectively to said signal conductors of said first and second modules; and
  said system ground conductor in combination with said first and second system signal conductors forming, respectively, first and second system microwave transmission lines which are respectively coupled to said module microwave transmission lines of said first and second modules.

24. An electronic system comprising:
a system substrate;
first and second microwave modules mounted on said substrate, each of said microwave modules including:
  a module substrate,
  a microwave electronic component disposed on said module substrate,
  a module dielectric layer overlying said substrate and said microwave component,
  a module ground conductor ohmically connected to a ground conductor of said microwave component,
  a module signal conductor disposed on said module dielectric layer and ohmically connected to a microwave signal terminal of said microwave component, said module signal conductor being spaced from said module ground conductor to form a module microwave transmission line;
said dielectric layer of first module being distinct from said dielectric layer of said second module;
a system dielectric layer overlying said first and second modules;
a system ground conductor;
first and second system signal conductors each disposed on said system dielectric layer and coupled respectively to said signal conductors of said first and second modules; and
said system ground conductor in combination with said first and second system signal conductors forming, respectively, first and second system microwave transmission lines which are respectively coupled to said module microwave transmission lines of said first and second modules.

25. The system recited in claim 24 wherein:
said system dielectric layer comprises a polymer.

26. The system recited in claim 24 wherein:
said second microwave module includes a second module microwave transmission line; and
said first system microwave transmission line couples said microwave transmission line of said first module to said second module microwave transmission line of said second module.

27. The system recited in claim 24 wherein:
said module dielectric layers each comprise a polymer.

28. The system recited in claim 24 comprising:
a system substrate, said first microwave module being disposed on said system substrate.

29. The system recited in claim 28 wherein:
said system dielectric layer overlies said system substrate.

30. The system recited in claim 28 wherein:
said system dielectric layer is bonded to said system substrate.

31. The system recited in claim 30 wherein:
said second microwave module includes a second module microwave transmission line; and
said first system microwave transmission line couples said microwave transmission line of said first module to said second module microwave transmission line of said second module.

32. A packaged microwave component comprising:
a package substrate,
a microwave component disposed on said package substrate,
a first package dielectric layer overlying said substrate and said microwave component,
a first package conductor disposed on said first package dielectric layer,
a second package dielectric layer overlying said first package conductor, and
a second package conductor overlying said second package dielectric layer;
said second package conductor being spaced from said first package conductor by said second package dielectric layer to form a package microwave transmission line, one of said first and second package conductors being the signal conductor of said package microwave transmission line and ohmically connected to a microwave signal terminal of said microwave component and the other of said first and second package conductors being a ground conductor of said package microwave transmission line and ohmically connected to a ground conductor of said microwave component;
said package microwave transmission line having a port portion suitable for coupling to an external microwave transmission line, said port portion exhibiting a specified microwave transmission line impedance, whereby said component is suitable for assembly into a larger system.

33. The packaged component recited in claim 32 further including:
a second package microwave transmission line;
the first recited package microwave transmission line comprising an input transmission line; and
said second package microwave transmission line comprising an output transmission line.

34. The packaged component recited in claim 33 wherein:
said first and second transmission lines exhibit the same impedance.

35. The packaged component recited in claim 32 wherein:
said first package conductor is a signal conductor; and
said second package conductor is a ground conductor.

36. The packaged component recited in claim 32 wherein:
said first package conductor is a ground conductor; and
said second package conductor is a signal conductor.

37. The packaged component recited in claim 32 wherein:
said package includes an additional microwave component; and
said package includes conductors interconnecting the first recited microwave component and said additional microwave component.

38. The packaged component recited in claim 37 wherein:
said packaged component is connected in a system with additional similar packages;
said system includes at least one dielectric layer which is disposed on the first recited package and at least one of said additional packages.

39. An electronic system comprising:
a system substrate;
first and second microwave modules mounted on said substrate, each of said microwave modules including:
  a module substrate,
  a microwave component disposed on said module substrate, a first module dielectric layer overlying said substrate and said microwave component, a first module conductor disposed on said first module dielectric layer, a second module dielectric layer overlying said first module conductor, a second module conductor overlying said second module dielectric layer, said second module conductor being spaced from said first module conductor by said second module dielectric layer to form a module microwave transmission line, one of said first and second module conductors being the signal conductor of said module microwave transmission line and ohmically connected to a microwave signal terminal of said microwave component and the other of said first and second module conductors being a ground conductor of said module microwave transmission line and ohmically connected to a ground conductor of said microwave component;

said dielectric layers of first module being separate from said dielectric layers of said second module;

a first system dielectric layer overlying said first and second modules;

first, second, third and fourth system conductors, said first and third system conductors being disposed on said first system dielectric layer;

a second system dielectric layer overlying said first and third system conductors, said second and fourth system conductors being disposed on said second system dielectric layer;

said first and second system dielectric layers each comprising a polymer;

said first and second system signal conductors forming a first system microwave transmission line and being coupled to said module microwave transmission line of said first module;

said third and fourth system signal conductors forming a second system microwave transmission line and being coupled to said module microwave transmission line of said second module.

40. The system recited in claim 39 wherein:
said first system dielectric layer overlies said system substrate.

41. The system recited in claim 39 wherein:
said first module conductor is a signal conductor; and
said second module conductor is a ground conductor.

42. The system recited in claim 39 wherein:
said first module is a ground conductor; and
said second module conductor is a signal conductor.

43. The system recited in claim 39 wherein:
said second microwave module includes a further module microwave transmission line; and
said first system microwave transmission line couples the microwave transmission line of said first module to said further module microwave transmission line of said second module.

44. The system recited in claim 39 wherein:
said first and second module dielectric layers each comprise a polymer.

45. The system recited in claim 44 wherein:
said first system dielectric layer overlies said system substrate.

46. The system recited in claim 45 wherein:
said first module conductor is a signal conductor; and
said second module conductor is a ground conductor.

47. The system recited in claim 45 wherein:
said first module is a ground conductor; and
said second module conductor is a signal conductor.

48. The system recited in claim 45 wherein:
said second microwave module includes a further module microwave transmission line; and
said first system microwave transmission line couples the microwave transmission line of said first module to said further module microwave transmission line of said second module.

49. The packaged microwave component recited in claim 39 wherein:
said package microwave transmission line comprises a microstrip transmission line.

* * * * *